United States Patent
Kobayashi (10) Patent No.: US 7,211,141 B2
(45) Date of Patent: May 1, 2007

(54) METHOD FOR PRODUCING A WAFER (75) Inventor: Takeshi Kobayashi, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 25 days.

(21) Appl. No.: 10/567,488

(22) PCT Filed: Aug. 4, 2004

(86) PCT No.: PCT/JP2004/011145

§ 371 (c)(1),
(2), (4) Date: Mar. 6, 2006

(87) PCT Pub. No.: WO2005/014898

PCT Pub. Date: Feb. 17, 2005

(65) Prior Publication Data
US 2006/0150894 A1  Jul. 13, 2006

(30) Foreign Application Priority Data

Aug. 12, 2003 (JP) ............... 2003-292539
Aug. 12, 2003 (JP) ............... 2003-292558
Aug. 12, 2003 (JP) ............... 2003-292596

(51) Int. Cl.
C30B 15/20 (2006.01)

(52) U.S. Cl. ............... 117/19; 117/3; 117/13; 117/20

(58) Field of Classification Search ............... 117/3, 117/13, 19, 20
See application file for complete search history.

(56) References Cited

FOREIGN PATENT DOCUMENTS

| JP | A 60-231365 | 11/1985 |
| JP | A 61-193456 | 8/1986 |
| JP | A 61-193458 | 8/1986 |
| JP | A 6-196430 | 7/1994 |
| JP | A 11-199387 | 7/1999 |
| JP | A 11-322490 | 11/1999 |
| JP | A 2000-211995 | 8/2000 |
| JP | A 2001-53078 | 2/2001 |
| JP | A 2001-77120 | 3/2001 |

*Primary Examiner*—Felisa Hiteshew (74) *Attorney, Agent, or Firm*—Oliff & Berridge, PLC (57) ABSTRACT The present invention is a method for producing a wafer comprising, at least, a BMD forming step of subjecting a silicon single crystal in a state of an ingot to heat treatment thereby to form bulk micro defects (BMDs) inside, and a wafer processing step of processing the ingot in which the bulk micro defects (BMDs) was formed into wafers. Thereby, there can be provided a method for producing a wafer, wherein heat treatment for providing IG capability in production of wafer can be shortened and wafers with high IG capability can be produced in large quantity. Also, the present invention can further comprise a wafer heat-treating step of subjecting the processed wafer to heat treatment, or an epitaxial growth step of forming an epitaxial layer on the wafer. Thereby, there is improved productivity of annealed wafers or epitaxial wafers that are excellent in gettering capability.

19 Claims, 7 Drawing Sheets

METHOD FOR PRODUCING A WAFER

TECHNICAL FIELD

The present invention relates to a method for producing a wafer, particularly a method for producing at low cost a wafer in which oxide precipitates and bulk micro defects (BMDs) are generated for providing Intrinsic Gettering (IG) capability.

Moreover, the present invention relates to a method for producing an annealed wafer, particularly, a method for producing an annealed wafer, wherein an oxygen out-diffusion heat treatment for forming a DZ (Denuded Zone) layer, which is a defect-free region, in the surface, and an heat treatment for generating oxide precipitates and bulk micro defects (BMDs) for providing IG capability are performed.

Furthermore, the present invention relates to a method for producing an epitaxial wafer, particularly, a method for effectively producing an epitaxial wafer that is excellent in gettering effect and has few defects of the epitakial layer.

BACKGROUND ART

A silicon single crystal wafer used as a substrate of a semiconductor integrated circuit device has mainly been produced by Czochralski method (CZ method). CZ method is a method that a seed crystal of silicon single crystal is immersed to a silicon melt melted in a quartz crucible at a high temperature of 1420° C. or more, the seed crystal is gradually pulled along with rotating the quartz crucible and the seed crystal, and thereby a columnar silicon single crystal is grown. At this time, a surface of the quartz crucible being in contact with the silicon melt is melted and oxygen is dissolved into the silicon melt and taken in the crystal during the growth. The oxygen atoms aggregate during the crystal growth and the cooldown to be oxygen precipitation nuclei. Therefore, if a silicon wafer obtained from the crystal grown as it is is subjected to heat treatment in a temperature zone from 700° C. to 1050° C., the nuclei are grown to form oxide precipitates and BMDs. The oxide precipitates have a beneficial role of capturing metal contamination caused by processes of integrated circuit device formation (device processes). This is so-called intrinsic gettering (IG).

That is, in the device processes, there is heavy-metal contamination as represented by Fe, Ni, and Cu in a heat-treating process at a high temperature and so forth. If by such heavy-metal contamination, defects or electrical levels are formed in the vicinity of a surface of the wafer, device characteristic is degraded. Therefore, because it is necessary that the heavy-metal contamination is removed from the vicinity of the wafer surface, there has been conventionally used a gettering technique of IG or various types of EG (Extrinsic Gettering). In particular, in the future device process, it is clear that still higher integration and temperature lowering of processes by using high-energy ion implantation will be promoted. In that case, it is anticipated that because of the temperature lowering of processes, it becomes difficult that BMDs are formed during the device processes. Therefore, in a low temperature process, it becomes more difficult to obtain sufficient IG effect than that in a high temperature process. Moreover, even if device processes are lowered in the temperature, it is difficult to avoid heavy-metal contamination by high-energy ion implantation and such, and therefore gettering technique is thought to be essential. Moreover, it is preferable that BMDs exist at high density for preventing generation of slip.

A general BMD formation has been performed by processing a silicon single crystal into wafers and then subjecting the wafers to heat treatment. For example, heat treatment referred to as DZ-IG heat treatment or the like is known. This is that by subjecting a wafer processed mirror-like to high-temperature treatment at a temperature of about 1100° C. to 1200° C., oxygen in the vicinity of the wafer surface is outward diffused to reduce interstitial oxygen to be nuclei of micro defects, and thereby a defect-free DZ (Denuded Zone) layer is formed in a device active region. Thereafter, BMDs are formed in the bulk of the wafer by low-temperature heat treatment at 600° C. to 900° C. As described above, two heat treatment steps of the high-temperature+the low temperature have been performed. Moreover occasionally, BMDs may be sufficiently formed first by performing low-temperature treatment, and then a DZ layer of the wafer surface may be formed by high-temperature heat treatment. Such a wafer in which a DZ layer and IG capability are given by performing heat treatment in a state of a wafer is referred to as an annealed wafer or the like.

On the other hand, in a silicon single crystal grown by CZ method, oxygen impurities are generally contained as described above. If the crystal as it is is used for device-producing processes, supersaturated oxygen is occasionally precipitated during the processes. There are some cases that the oxide precipitates secondarily cause dislocations, stacking faults, or the like, by strain due to expansion of volume. Such oxide precipitates and the secondary defects thereof have a great effect on characteristics of semiconductor device. Therefore, in the case that such defects exist in the wafer surface and the device active layer, there is occasionally caused increase of leakage current, fault of oxide dielectric breakdown voltage, or the like.

Moreover, as devices come to have higher integration and become finer, Grown-in defects introduced in pulling a silicon single crystal by CZ method, which haven't been historically seen as a problem, significantly degrade oxide dielectric breakdown voltage characteristic. Therefore, whether crystallinity in the vicinity of a surface of a silicon single crystal substrate is good or bad comes to have a great impact on reliability and process yield of the device.

As a measure against that, there is a technique that a wafer is subjected to heat treatment to annihilate defects on the wafer surface. As the heat treatment of a wafer, there is a method that a silicon substrate is heated in a hydrogen atmosphere or in an atmosphere containing hydrogen at 950° C. to 1200° C. for 5 minutes or more and thereby a DZ layer is formed in a silicon wafer surface part by promotion of oxygen out-diffusion, (see, for example, Japanese Patent Application Laid-open (kokai) No. 60-231365, No. 61-193456, and No. 61-193458).

Moreover, in recent years, it has been devised that nitrogen is doped in a wafer (ingot) and thereby defects originating in crystal such as COP (Crystal Originated Particle) are easily annihilated and oxide precipitates can be easily obtained. Thereby, it has become possible that annealed wafers with a wide defect-free region are effectively produced. Moreover, it has been possible that high-quality wafers are produced effectively in the case that after-mentioned epitaxial wafers are produced using such substrates.

Furthermore, there is known a crystal consisting of a region having excess atomic vacancies but no defects introduced during crystal growth (defects such as COP) and a region having excess interstitial silicon atoms but no defects introduced during crystal growth. This can be obtained by controlling pulling rate of a crystal and such, and can be wafers having very few crystal defects. Such a crystal consisting of a region having excess atomic vacancies but no defects introduced during crystal growth, and a region having excess interstitial silicon atoms but no defects introduced during crystal growth is referred to as nearly perfect crystal, hereinafter occasionally referred to as NPC. Also, using such a crystal, annealed wafers each having a wide defect-free region can be produced effectively (see, for example, Japanese Patent Application Laid-open (kokai) No. 11-199387). Moreover, if epitaxial growth is performed on the wafer that such a crystal is used, high-quality wafers can be produced effectively.

However, annealing as described above, which is referred to as DZ-IG heat treatment, requires much time because a wafer is subjected to two-step heat treatment having the different purposes of DZ layer formation and BMD formation. In particular, for forming BMDs at high density, it is necessary to subject a wafer to heat treatment at a low temperature for a sufficient time.

Figure 6:
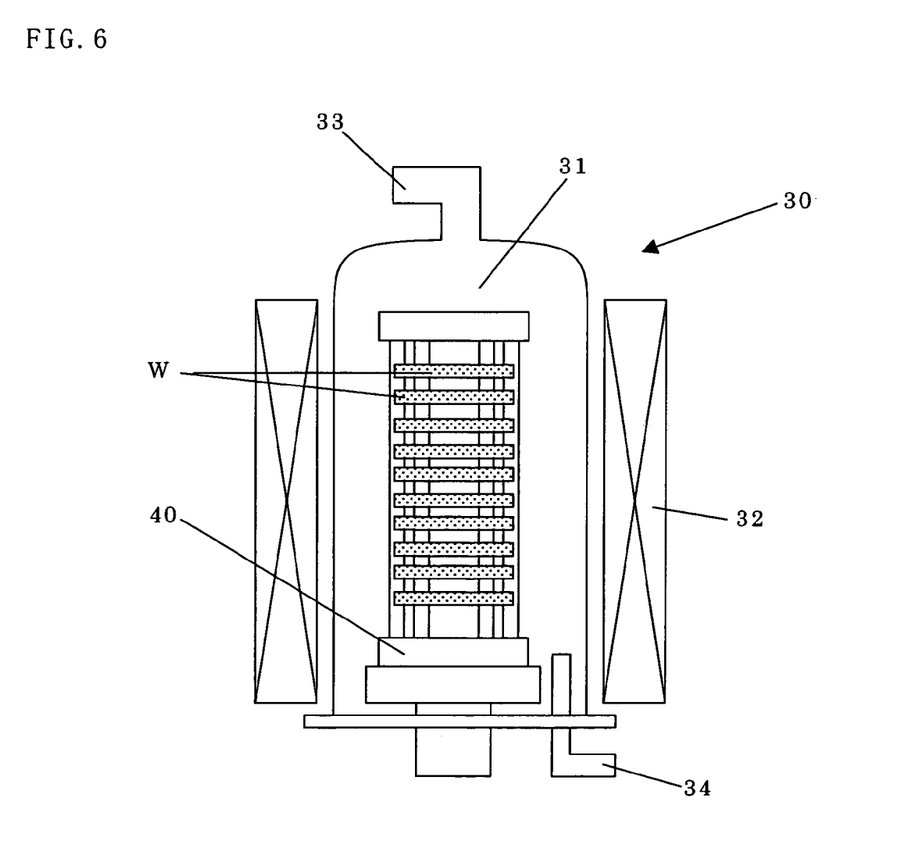
FIG. 6 is an explanatory view of an example of a vertical apparatus for heat treatment available in heat treatment of a wafer.
Figure 7:
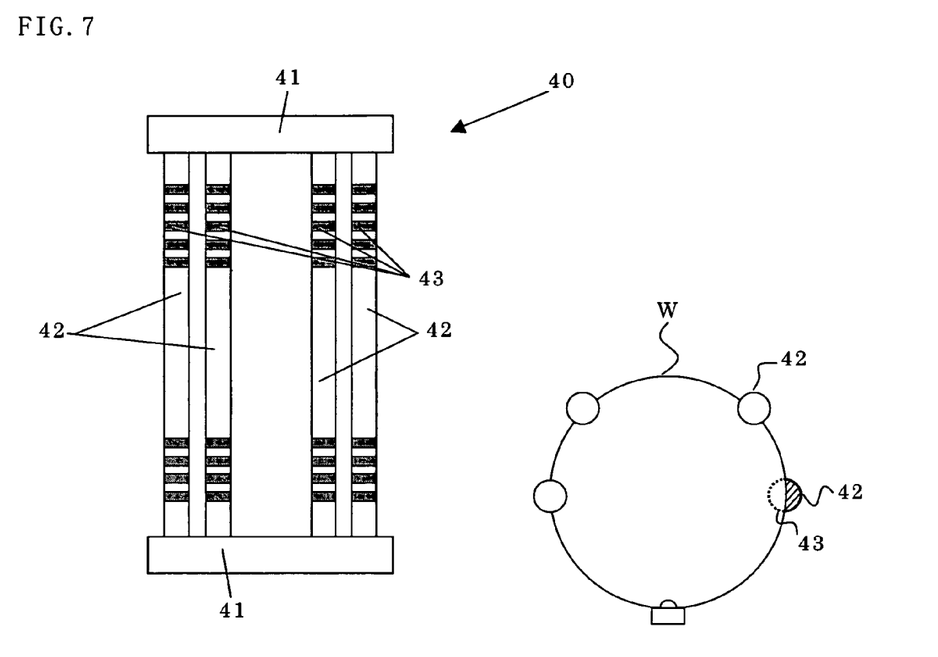
FIG. 7 is an explanatory view of an example of a boat for heat treatment available in heat treatment of a wafer.

In the case that heat treatment is performed in a wafer state processed into a silicon wafer, a vertical heat treatment apparatus 30 is used as shown in FIG. 6, wafers W set in a heat treatment boat 40 are heated in a chamber 31 by a heater 32. Moreover, for setting the wafers, the heat treatment boat 40 is used as shown in FIG. 7, and wafers W are held in groove like wafer-placed parts 43 provided in a plurality of columns 42 connected by connection parts 41. However, the number of wafers able to be set therein is limited to at most about one hundred. Therefore, for producing annealed wafers in large quantity, it is necessary that many heat treatment apparatuses are prepared or annealing time is shortened.

However, as a wafer has a larger diameter, such an apparatus for performing heat treatment also becomes larger and a heat treatment boat used for it and such also become larger, and thus very expensive apparatuses become required in terms of equipment. Therefore, there is cost limitation for introducing many apparatuses, it is more important to effectively operate a heat treatment apparatus.

On the other hand, nowadays, an epitaxial wafer in which a single crystal layer is grown on its surface is occasionally used. There is an advantage that an epitaxial wafer has good crystallinity in the vicinity of the surface thereof. Moreover, according to the technique of epitaxial growth, it can be performed with relative ease that a sharp gradient of impurity concentration is formed inside a wafer or a layer with low concentration is formed inside a layer with high concentration. Therefore, an epitaxial wafer is an essential wafer for fabricating a bipolar transistor or a schottky barrier diode. In formation of such an epitaxial wafer, a high-temperature process at 1000° C. or more is performed.

The above-mentioned high-temperature process at 1000° C. or more includes the epitaxial growth in itself and a pretreatment performed before the epitaxial growth. The epitaxial growth of a silicon crystal thin film is typically performed by supplying a silicon compound gas such as $SiCl_4$, $SiHCl_3$, $SiH_2Cl_2$, or $SiH_4$ and a dopant gas such as $B_2H_6$ or $PH_3$ in $H_2$ atmosphere in a temperature zone of 1000 to 1200° C.

On the other hand, the pretreatment is an operation for removing a native oxide film and particles which exist on a surface of the silicon single crystal substrate. In particular, before the epitaxial growth is performed, cleaning of the surface of the silicon single crystal substrate is an essential treatment. A method occasionally used for removing a native oxide film and particles is that of subjecting the substrate to heat treatment in a gas of $H_2$ or a mixed gas of $H_2/HCl$ at a high temperature near 1100° C. Otherwise, as methods that are practicable near a room temperature, wet etching using a dilute solution of hydrofluoric acid, combination of a hydrofluoric gas and a water vapor, and Ar plasma treatment are known. However, there are problems such as regrowth of an oxide film immediately after the treatment, occurrence of surface roughness of a substrate, and corrosion of treatment equipment. Therefore, it is thought that the high-temperature treatment described above is most appropriate as it is now.

However, as for an epitaxial wafer as described above, there are some cases that gettering effect is not sufficient. This is because a substrate to be an epitaxial wafer goes through a high-temperature process of 1000° C. or more, almost all of oxygen precipitation nuclei and oxide precipitates are annihilated and gettering function comes not to be accomplished. In a conventional method, by the pretreatment before the epitaxial growth, it is difficult to sufficiently remove a native oxide film in a temperature zone of less than 1000° C. Therefore, the pretreatment cannot help but being performed in a temperature zone of 1000° C. or more. Accordingly, it was impossible to avoid lowering of gettering efficiency of an epitaxial wafer, conventionally.

In order to obtain gettering effect for such a substrate, it has been necessary that heat treatment for forming BMDs is performed before or after forming an epitaxial layer, and much time has been spent. In particular, in order to form the requisite BMDs for obtaining gettering effect, it is necessary to subject a wafer to heat treatment at a low temperature for a sufficient time.

DISCLOSURE OF THE INVENTION

The first object of the present invention is to provide a method for producing a wafer wherein heat treatment for providing IG capability in producing the wafer can be reduced and wafers with high IG capability can be produced in large quantity.

Moreover, the second object of the present invention is to provide a method for producing a wafer wherein the number of annealed wafers to be produced is increased in performing heat treatment effectively in production of annealed wafers in which much time and cost are spent on heat treatment such as oxygen out-diffusion heat treatment for forming a DZ layer as described above or heat treatment for generating oxide precipitates and BMDs for providing IG capability.

Furthermore, the third object of the present invention is to provide a method for producing an epitaxial wafer, wherein heat treatment is effectively performed in production of an epitaxial wafer as described above and thereby productivity of an epitaxial wafer that is excellent in gettering effect is improved.

The present invention for accomplishing the above first object is a method for producing a wafer comprising at least an ingot heat-treating step of subjecting a silicon single crystal in a state of an ingot to heat treatment, and a wafer processing step of processing the heat-treated ingot into wafers.

As described above, by subjecting a silicon single crystal in a state of an ingot to heat treatment and thereby to provide IG capability, heat treatment that has been conventionally performed after the processing into wafers can be effectively performed in advance and thereby productivity can be considerably improved.

In this case, it is preferable that in the ingot heat-treating step, bulk micro defects (BMDs) are formed in the silicon single crystal.

That is to say, it is a method for producing a wafer comprising, at least, a BMD forming step of subjecting a silicon single crystal in a state of an ingot to heat treatment and thereby to form the BMDs (bulk micro defects) inside, and a wafer processing step of processing the ingot in which BMDs were formed into wafers.

As described above, by subjecting in advance a silicon single crystal in a state of an ingot to heat treatment as an ingot heat-treating step (in the present invention, occasionally referred to as a BMD forming step or the first heat-treating step) and processing the ingot into wafers in a wafer processing step, heat treatment can be performed more effectively, compared to a conventional method of performing heat treatment for forming BMDs in a silicon single crystal in a state of a wafer. Therefore, BMDs can be more effectively formed and thereby wafers having high IG capability can be produced in large quantity. Moreover, wafers having high IG capability from the beginning can be provided for later steps such as device steps.

Also, the method can further comprise a wafer heat-treating step of subjecting the wafers to heat treatment after the wafer processing step.

That is, the present invention for accomplishing the above second object is a method for producing an annealed wafer, comprising at least an ingot heat-treating step of subjecting a silicon single crystal in a state of an ingot to heat treatment, a wafer processing step of processing the heat-treated ingot into wafers, and a wafer heat-treating step of subjecting the wafers to heat treatment (in the present invention, occasionally referred to as the second heat treating step).

As described above, by subjecting in advance a silicon single crystal in a state of an ingot to heat treatment in an ingot heat-treating step, processing the heat-treated ingot into wafers in a wafer processing step, and then subjecting the wafers to heat treatment in a wafer heat-treating step, heat treatment can be more effectively performed, compared to a conventional method of subjecting a wafer to two-step heat treatment. Moreover, because heat treatment time in a state of a wafer can be reduced, metal contamination to a wafer can be reduced.

It is preferable that, in the wafer processing step, the heat-treated ingot is processed into mirror-like wafers.

By processing the ingot heat-treated in the ingot heat-treating step into mirror-like wafers in the wafer processing step, it is needless to perform mirror-polishing, which makes a thickness of the DZ layer reduced, after performing the wafer heat-treating step for forming the DZ layer. The thick DZ layer obtained in the wafer heat-treating step as it is can be used for a region for device fabrication.

In this case, the method may further comprise an epitaxial growth step of forming an epitaxial layer on the wafer after the processing into mirror-like wafer.

That is, the present invention for accomplishing the above third object is a method for producing an epitaxial wafer comprising at least a heat-treating step of subjecting a silicon single crystal in a state of an ingot to heat treatment, a wafer processing step of processing the heat-treated ingot into mirror-like wafers, and an epitaxial growth step of forming an epitaxial layer on the wafer.

As described above, by subjecting in advance a silicon single crystal in a state of an ingot to heat treatment in a heat-treating step, processing the ingot into wafers in a wafer processing step, and then forming an epitaxial layer on the wafer in an epitaxial growth step, heat treatment can be more effectively performed, compared to a conventional method of subjecting a wafer to heat treatment.

It is preferable that in the ingot heat-treating step, the silicon single crystal in a state of an ingot is subjected to heat treatment at 700° C. or more.

By subjecting the silicon single crystal in a state of an ingot to heat treatment at 700° C. or more as described above, sufficient BMDs can be formed inside.

It is preferable that in the ingot heat-treating step, the heat treatment is performed at a heat treatment temperature of 1100° C. or less for 30 minutes to 8 hours.

By performing the heat treatment at a heat treatment temperature of 1100° C. or less, the heat treatment can be performed without causing dislocation or slip in the single crystal. And, by performing the heat treatment for 30 minutes to 8 hours, a good IG capability can be provided.

Therefore, it is preferable that in the ingot heat-treating step, the heat treatment is performed at a heat treatment temperature of 700° C. to 1100° C. for 30 minutes to 8 hours.

By performing the ingot heat-treating step in such a temperature range, sufficient BMDs can be formed without causing dislocation or slip in the single crystal. Moreover, by performing the ingot heat-treating step in such a time, a good IG capability can be provided.

In particular, in the case that an epitaxial wafer is produced, it is preferable that in the ingot heat-treating step, the heat treatment is performed at a heat treatment temperature of 700° C. to 900° C. for 30 minutes to 8 hours.

By performing the ingot heat-treating step in such a temperature range, in the case that an epitaxial layer is formed later, sufficient BMDs can be formed without generating defects of the epitaxial layer from BMDs exposed on the wafer surface of a substrate. Moreover, by performing the ingot heat-treating step in such a time, a good IG capability can be provided.

It is preferable that in the ingot heat-treating step, the heat treatment is performed at a temperature rising rate of 0.5° C./min to 10° C./min.

By performing the heat treatment at such a temperature rising rate, stable BMDs can be formed in the ingot. In addition, for precipitating BMDs at high density, it is preferable that temperature is slowly raised at a rate of 5° C./min or less in a temperature zone where BMD precipitation nuclei are generated, for example at 500° C. or more. At a lower zone than that (less than 500° C.), the ingot is treated so that the temperature may be raised at a relatively high speed of about 10° C./min.

It is preferable that in the wafer heat-treating step, a defect-free region (a DZ layer) is formed in a surface of the wafer.

By forming a DZ layer in a surface of the wafer in the wafer heat-treating step, a DZ wafer which is excellent in crystallinity in the vicinity of a surface of the wafer can be produced. In particular, because BMDs are formed by subjecting in advance a silicon single crystal in a state of an ingot in the ingot heat treatment and thereby BMDs are formed, the heat treatment for forming the DZ layer can be performed according to a simple sequence in a short time.

It is preferable that in the wafer heat-treating step, the heat treatment is performed in such a heat treatment temperature of 900° C. to 1300° C. for 5 minutes to 16 hours.

By performing the wafer heat-treating step at such a temperature range and in such a heat treatment time, a DZ layer having a sufficient thickness can be formed without causing slip in the wafer.

It is preferable that in the wafer heat-treating step, the temperature is raised at a temperature rising rate of 5° C./min or more.

Because a silicon single crystal in a state of an ingot is subjected in advance to heat treatment in the ingot heat-treating step in the present invention as described above, a temperature rising rate can be higher than that of a conventional method from the beginning in the wafer heat-treating step performed for a wafer and thereby the heat-treating time can be shortened. And also, because the ingot heat treating step is performed, there can be obtained an annealed wafer having a sufficient BMD density and a DZ layer even at such a temperature rising rate.

In the epitaxial growth step, after a pretreatment is performed at a temperature of 1000° C. or more, the epitaxial growth may be performed at a temperature of 1000° C. or more.

In the present invention, by performing the epitaxial growth at a temperature of 1000° C. or more after a pretreatment is performed at a temperature of 1000° C. or more as described above, a native oxide film can be sufficiently removed by the pretreatment and high-quality epitaxial growth can be efficiently performed. In particular, because precipitation nuclei of BMDs are sufficiently formed in a state of an ingot at the beginning, even if an epitaxial layer is formed by such a high-temperature process, an epitaxial wafer having a good IG capability can be produced without lowering gettering effect.

It is preferable that the silicon single crystal is a crystal doped with nitrogen.

By doping the silicon single crystal with nitrogen, a DZ layer and BMDs can be easily formed by heat treatment.

Moreover, by doping the silicon single crystal with nitrogen, after the epitaxial growth step, a wafer that has few defects of the epitaxial layer and is high in IG effect can be produced efficiently.

The silicon single crystal can be a crystal in a nearly perfect crystal (NPC) region produced by Czochralski method.

Such a crystal can be a higher-quality wafer with a thick DZ layer, for example, in the case of making it into an annealed wafer in later steps.

Moreover such a crystal can be a higher-quality wafer with few defects in an epitaxial layer, in the case of making it into an epitaxial wafer.

The silicon single crystal in a state of an ingot may be an ingot pulled by a single crystal-pulling apparatus by Czochralski method as it is or an ingot in a state that the pulled ingot is cylindrically ground and cut in a shape of a block.

In the present invention, because the silicon single crystal in a state of the ingot as described above is subjected to heat treatment and thereby BMDs are formed inside, BMDs can be efficiently formed in the single crystal.

By the way, an ingot pulled by a single crystal-pulling apparatus as it is includes not only a crystal immediately after being pulled by Czochralski method, but also a crystal in which a cone part and a tail part of a pulled ingot were cut off, and a crystal cut into several blocks therefrom.

According to a method for producing a wafer by the present invention, a heat treatment for forming BMDs is performed in a state of an ingot at the beginning, and thus a wafer with high IG capability can be supplied to later steps such as device steps. Moreover, the heat treatment for forming BMDs can be efficiently performed because of performing in large quantity at one time. And, heat-treating time for providing IG capability is greatly reduced. Thereby, productivity of wafer production can be improved.

Moreover, according to a method for producing an annealed wafer by the present invention, because heat treatment for forming BMDs can be efficiently performed in a state of an ingot at the beginning, heat treatment for forming BMDs can be efficiently performed, and heat-treating time can be greatly reduced in a heat treatment for forming a DZ layer to be performed later. Thereby, productivity in production of annealed wafers can be improved. Furthermore, because heat-treating time in a state of a wafer can be shortened, metal contamination to the wafer can be also reduced.

Further, according to a method for producing a wafer by the present invention, because BMDs are formed in a state of an ingot at the beginning, even if an epitaxial layer is formed after processing into wafers, BMDs are not annihilated. Thereby, there can be an epitaxial wafer with high IG capability in which BMDs were precipitated at high density. Moreover, because the heat treatment for forming BMDs is not heat treatment in a state of a wafer but heat treatment in a state of an ingot, a large number of wafers (as converted into wafers) can be treated at one time and productivity is improved.

BEST MODE FOR CARRYING OUT THE INVENTION

Hereinafter, the present invention will be explained in detail.

The present inventor found that in the case that a wafer with high IG capability is produced, BMDs for enhancing IG effect are formed by performing heat treatment in a state of an ingot, and by processing into wafers, a wafer with high IG capability in which BMDs are formed can be produced efficiently, and also in subsequent processes of DZ layer formation or epitaxial layer formation, BMD density can be maintained sufficiently.

Conventionally, an annealing in a state of an ingot (hereinafter, occasionally referred to as an ingot annealing) is a technique that has been mainly performed in compound semiconductors such as GaAs and has been performed solely for uniformly improving electric characteristics (see, for example, Japanese Patent Application Laid-open (kokai) No. 6-196430, or No. 6-31854). In the present invention, by subjecting a silicon single crystal in a state of an ingot to heat treatment for forming BMDS, wafers with high IG capability can be produced in a short time in large quantity. That is, a method for producing a wafer according to the present invention is characterized by forming BMDs inside an silicon single crystal in a state of an ingot and thereafter performing processing into an wafer.

The present invention is that BMDs are formed in an state of an ingot as described above, this is processed into wafers to produce a wafer provided with IG capability. Thereby, for example, even when an annealed wafer is produced after that, heat treatment on a condition for providing IG capability can be omitted or simplified, and heat-treating time can be shortened. Moreover, for example, also in the case that an epitaxial layer is formed on such a wafer and thereby an epitaxial wafer is produced, there can be obtained a wafer with high gettering effect. Moreover, because of heat treatment in a state of an ingot, it is not necessary to use a boat for heat treatment of wafers, and thus compared to a conventional heat treatment for forming BMDs in a state of a wafer, heat treatment can be performed at one time in large quantity (as converted into wafers) and efficiency of heat treatment can be greatly improved.

Concretely, a silicon single crystal in a state of an ingot is subjected to heat treatment at 700° C. or more, and thereafter it is processed into wafers. In particular, in the heat treatment step that a silicon single crystal in a state of an ingot is subjected to heat treatment to form BMDs inside the ingot, the heat treatment may be performed at a heat treatment temperature of 700° C. to 1100° C. for 30 minutes to 8 hours. Moreover, by performing heat treatment at a temperature rising rate of 0.5° C./min to 10° C./min, stable BMDs can be formed.

By performing heat treatment at a temperature of 1100° C. or less in a state of an ingot, dislocation or slip can be prevented from being generated in the entire ingot. Moreover, by performing heat treatment at a temperature of 700° C. or more, sufficient BMDs can be formed. Further by performing heat treatment at a temperature of 700° C. or more, BMDs that are not annihilated in later steps (for example, an annealing step in a state of a wafer) can be formed.

In such a temperature range, by keeping a constant temperature, for example, for 30 minutes to 8 hours or by performing multi-step heat treatment of keeping a constant temperature, sufficient BMDs can be formed. The BMDs stay in later steps without being annihilated and thereby good IG capability can be provided. The treatment time is not particularly limited. The treatment time may be longer. However, about the range described above is appropriate for obtaining temporal merits and good IG capability. In this case, it is preferable that a temperature rising rate is 0.5° C./min to 10° C./min.

Moreover, it is preferable that the ingot is a crystal doped with nitrogen, or a crystal being in NPC region.

In particular, in the case that heat treatment is performed using a silicon single crystal doped with nitrogen, oxide precipitates can be easily obtained inside the crystal, and defects due to crystal such as COP become easier to be annihilated by the heat treatment. By using such a silicon single crystal, there can be effectively produced a wafer with a wide defect-free region and with high IG effect, for example, in the case that a step for forming a DZ layer is performed later.

A crystal in NPC region is also preferable because it becomes a wafer with a wide defect-free region in the same manner. The crystal in NPC region is a crystal which was grown in a region having excess atomic vacancies but no defects introduced during crystal growth (occasionally referred to as a Nv region) and a region having excess interstitial silicon atoms but no defects introduced during crystal growth (occasionally referred to as a Ni region) by controlling the condition for pulling the crystal.

In particular, it is known that oxygen precipitation behaviors in NPC region are different between Nv region and Ni region. In the case of exhibiting such different oxygen precipitation behaviors, it is preferable that the temperature is raised slowly from a low temperature, for example, from a low temperature region like 300–500° C., at a slow temperature rising rate of about 0.5–2° C./min in an ingot stage, because oxygen precipitation behaviors in Nv and Ni region are uniformed and stable BMD formation can be performed in a plane without depending on Nv or Ni region. Conventionally, if such heat treatment is performed in a state of a wafer, productivity is significantly reduced and therefore it cannot have been carried out in practice. However in a stage of an ingot, even if such slow heat treatment is performed, a large amount of treatment can be performed at one time can be performed and therefore high productivity can be maintained.

The silicon single crystal in a state of an ingot is an ingot pulled by a single crystal-pulling apparatus as it is or an ingot in a state that the pulled ingot is cylindrically ground and cut in a shape of a block. In a silicon single crystal pulled by a single crystal-pulling apparatus, a cone part and a tail part are formed. Ingot annealing can be performed in such a state of an ingot (including a state that a cone part and a tail part were removed, and a state divided into a plurality of blocks).

Moreover, before processing into wafers (before slicing), generally, an ingot is cylindrically ground and thereafter divided into a plurality of blocks. Therefore, a heat treatment may be performed in a state of such a cylindrically ground block. In this case, because metal contamination is caused by the cylindrical grinding in a surface layer of the block, it is preferable that after about 100 to 500 µm of the surface layer is removed by acid etching, the heat treatment is performed.

Moreover, the present inventor found that in the case that an annealed wafer is produced, BMDs for enhancing IG effect are formed by performing heat treatment in a state of an ingot, thereafter it is processed into wafers, further heat treatment is performed in a state of a wafer, and thereby heat treatment can be performed efficiently and there can be produced an annealed wafer in which BMDs are sufficiently formed and DZ layer is also sufficiently formed.

That is, the method for producing an annealed wafer according to the present invention is characterized by comprising the first heat-treating step of subjecting a silicon single crystal in a state of an ingot to heat treatment, a wafer processing step of processing the heat-treated ingot into wafers, and the second heat-treating step of subjecting the wafer to heat treatment. In particular, it is characterized that the first heat-treating step of subjecting a silicon single crystal in a state of an ingot to heat treatment is a heat treating step for forming BMDs, and the second heat-treating step of subjecting the wafer to heat treatment is a heat-treating step for forming a defect-free region (a DZ layer) in the wafer surface.

It was found that if such ingot annealing is applied to an ingot of a silicon single crystal to be raw material of annealed wafers, good annealed wafers can be obtained. In particular, it is preferable that BMDs are formed by performing heat treatment at 700° C. or more in a state of an ingot.

That is, the present invention is that out of two-step heat treatments for forming a DZ layer and BMDs applied to a wafer conventionally, a heat treatment for forming BMDs is performed in a stage of an ingot, and as for heat treatment in a final state of a wafer, a heat treatment for forming BMDs is omitted or simplified and thereby heat-treating time for subjecting the wafer to heat treatment is shortened. That is, by performing heat treatment for forming BMDs in a state of an ingot, it is needless to use a wafer heat-treating boat as a conventional method. Therefore, heat treatment that corresponds to several of or several tens of batches in a state of a wafer can be performed at one-time heat treatment and efficiency of heat treatment can be greatly improved. And in the heat treatment in a state of a wafer, the heat treatment for forming BMDs can be omitted or simplified and thereby heat-treating time can be shortened to about half as compared to a conventional method. Productivity of annealed wafers can be greatly improved.

Annealing in a state of a wafer for forming a DZ layer (the second heat-treating step) is a simplified treatment of conventional two-step heat treatment, and the heat treatment may be performed on a condition for forming mainly a DZ layer. Concretely, the heat treatment is performed by keeping heating at a temperature of 900° C. to 1300° C. for 5 minutes to 16 hours. In particular, 1100° C. or more is preferable. The heat-treating time may be set appropriately according to a required thickness of a DZ layer and such.

As described above, a silicon single crystal subjected to heat treatment in a state of an ingot is processed into wafers, further heat treatment is performed in a state of a wafer, and thereby there can be effectively produced an annealed wafer with a wide defect-free region and with high IG effect.

Furthermore, the present inventor found that in the case that an epitaxial wafer is produced, for example, BMDs for enhancing IG effect are sufficiently formed by performing heat treatment in a state of an ingot as it is, thereafter it is processed into wafers, further epitaxial growth is performed on a surface thereof, and thereby there can be efficiently produced an epitaxial wafer that BMDs are sufficiently formed and gettering effect is high.

That is, the method for producing an epitaxial wafer according to the present invention is characterized by comprising a heat-treating step of subjecting a silicon single crystal in a state of an ingot to heat treatment, a wafer processing step of processing the heat-treated ingot into wafers, and an epitaxial growth step of forming an epitaxial layer on a mirror-polished wafer. In particular, it is characterized that the heat-treating step of subjecting a silicon single crystal in a state of an ingot to heat treatment is a heat treating step for forming BMDs.

The present inventor found that if ingot annealing is applied to an ingot of a silicon single crystal to be raw material of an epitaxial wafer, a good epitaxial wafer can be obtained efficiently. Conventionally, it was necessary that the heat treatment for forming BMDs was performed on a silicon single crystal in a state of a wafer before or after an epitaxial layer is formed thereon. However, in a heat-treating apparatus and a wafer heat-treating boat that are used for heat treatment of wafers, the number of wafers able to be set at one time is limited to at most about one hundred and thus the efficiency of heat treatment is low. However, by performing the heat treatment for forming BMDs in a state of an ingot, it is needless to use a wafer heat-treating boat like a conventional method and thus heat treatment that corresponds to several of or several tens of batches in a state of a wafer can be performed at one time and the efficiency of heat treatment can be greatly improved.

In particular, it is preferable that heat treatment is performed at 700° C. to 900° C. in a state of an ingot and thereby BMDs are formed. By performing heat treatment at a temperature of 900° C. or less, dislocation or slip is prevented from being generated in the entire ingot, and it can be prevented that BMDs are exposed on the wafer surface and thereby defects in an epitaxial layer are generated. Moreover, by performing heat treatment at a temperature of 700° C. or more, BMDs formed in a state of an ingot can be prevented from being annihilated in the epitaxial growth step.

Therefore, by subjecting a silicon single crystal in a state of an ingot to heat treatment at a heat treatment temperature of 700° C. to 900° C., no defects of an epitaxial layer are generated and BMDs with appropriate sizes so as not to be annihilated in the epitaxial step can be sufficiently formed inside the ingot. Concretely, when heat treatment is performed at a heat treatment temperature of 700° C. to 900° C. by keeping a constant temperature for 30 minutes to 8 hours or by performing multi-step heat treatment with keeping a constant temperature in each step, and also stable BMDs can be formed by keeping a temperature rising rate of 0.5° C./min to 10° C./min.

Moreover, it is preferable that the ingot is a crystal doped with nitrogen, or a crystal in NPC region.

In particular, in the case that heat treatment is performed using a silicon single crystal doped with nitrogen, defects originated from crystal such as COP become easy to be annihilated, and oxide precipitates become easy to be obtained inside the crystal. By using such a silicon single crystal, there can be effectively produced a wafer with few defects and a wafer with high IG effect in also the epitaxial growth step.

Also with regard to a crystal in NPC region, a wafer having few defects in an epitaxial layer can be obtained in the same manner.

A method for forming an epitaxial layer may be a conventional method. For example, there may be a method that a pretreatment having a high-temperature process at 1000° C. or more is performed, and thereafter epitaxial growth is performed at a temperature of 1000° C. or more. Concretely, the epitaxial growth of a silicon crystal thin film is performed in a temperature zone of 1000 to 1300° C. by supplying a silicon compound gas such as $SiCl_4$, $SiHCl_3$, $SiH_2Cl_2$, or $SiH_4$ and a dopant gas such as $B_2H_6$ or $PH_3$ into $H_2$ atmosphere.

On the other hand, the pretreatment performed before epitaxial growth is an operation for removing a native oxide film and particles which exist on a surface of the silicon single crystal substrate. In particular, before the epitaxial growth is performed, cleaning of surface of the silicon single crystal substrate is an essential treatment. A method that is often used for removing the native oxide film and particles is a method of subjecting a substrate to heat treatment in an atmosphere of gas of $H_2$ or mixed gas of $H_2$/HCl at a high temperature of 1000° C. to 1300° C., particularly near 1100° C.

Such an ingot subjected to heat treatment in a state of a silicon single crystal is processed into wafers to be material for epitaxial wafers, and thereby it becomes possible that an epitaxial wafer having no defects and having high IG capability is produced effectively.

Figure 1:
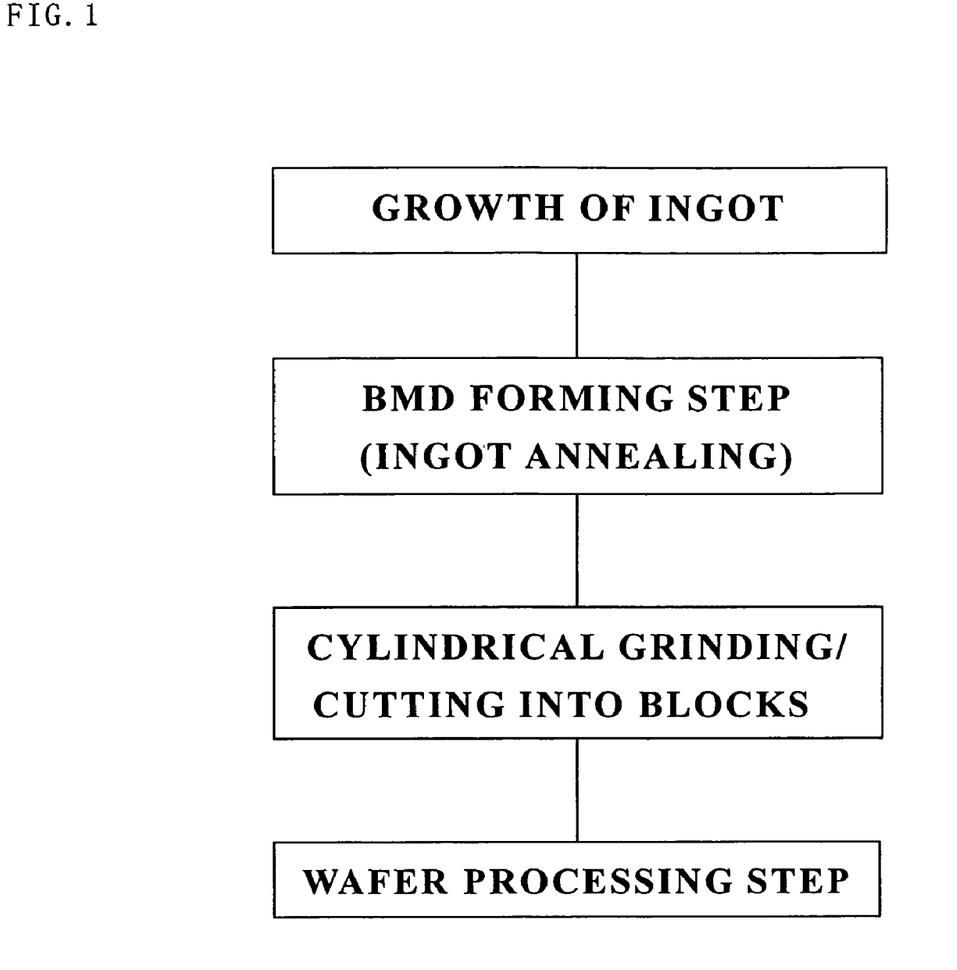
FIG. 1 is a flow diagram showing an example of a process for producing a wafer according to the present invention.
Figure 2:
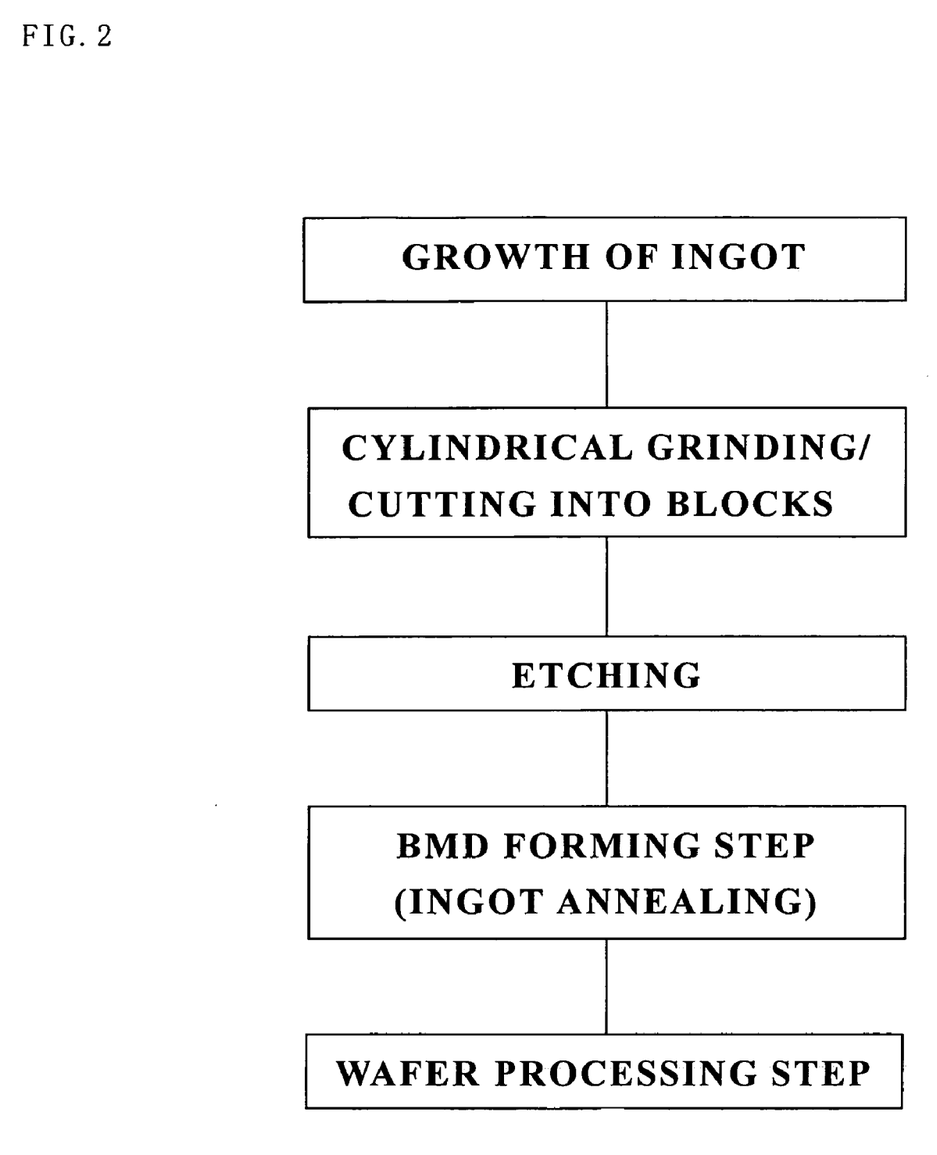
FIG. 2 is a flow diagram showing another example of a process for producing a wafer according to the present invention.

Hereinafter, the method for producing a wafer according to the present invention will be explained in more detail with reference to drawings. FIG. 1 and FIG. 2 are flow diagrams showing overview of steps of producing a wafer according to the present invention.

<Growth of an Ingot>

First, a silicon single crystal ingot is grown by CZ method along with controlling an oxygen concentration (and a nitrogen concentration), resistivity, and so on. The pulling method isn't particularly limited and a method that has been performed conventionally may be used. In particular, it is preferable that an ingot is pulled on such a condition that defects originated from crystal such as COP become small.

In particular, by doping a silicon single crystal with nitrogen, a silicon single crystal that is easy to form a DZ layer and BMDs can be grown. In the present invention, for growing a silicon single crystal ingot doped with nitrogen, in the case that a silicon single crystal is grown by Czochralski method, nitride is preliminarily put in a quartz crucible, nitride is thrown in silicon melt, or an atmosphere containing nitrogen is used as atmosphere gas or the like, and thereby the silicon single crystal can be doped with nitrogen. At this time, nitrogen-doping amount in the crystal can be controlled by adjusting nitride amount, nitrogen gas concentration, introduction time, or the like.

Moreover, by using a silicon single crystal in a nearly perfect crystal (NPC) region, there can be produced an annealed wafer with a thick DZ layer in the case that annealing is performed in a state of a wafer. For producing the silicon single crystal in a nearly perfect crystal region, for example, by pulling a crystal along with controlling V/G, which is a ratio of a pulling rate V and crystal temperature gradient G near a solid-liquid interface along the axis of pulling when a single crystal is grown by Czochralski method, it is possible to pull a silicon single crystal in a nearly perfect crystal (NPC) region over the entire plane of horizontal section of the crystal.

<Ingot Annealing: Step for Forming BMDs, The First Heat-Treating Step>

Next, the ingot grown like this is subjected to heat treatment in a shape of an ingot and thereby BMDs are formed inside. That is, heat treatment is performed before slicing step of processing the ingot into be a wafer form (before wafer processing step). In this case, the heat treatment is performed on a condition that BMDs are formed. At this time, ingot annealing is performed in a shape of an ingot pulled by a single crystal-producing apparatus (an ingot-pulling apparatus) as it is or in a state that the pulled ingot was cylindrically ground and cut in a shape of a block. That is, the annealing can be performed either before or after the outer circumferential part of the ingot is cylindrically ground.

First, with regard to the ingot annealing in a pulled shape as it is, one embodiment thereof will be explained (FIG. 1).

In this example, an ingot is put in a heat-treating furnace without removing a cone part and a tail part of the ingot pulled by a single crystal-producing apparatus and without dividing it into a plurality of blocks, and heat treatment for forming BMDs is performed.

Figure 3:
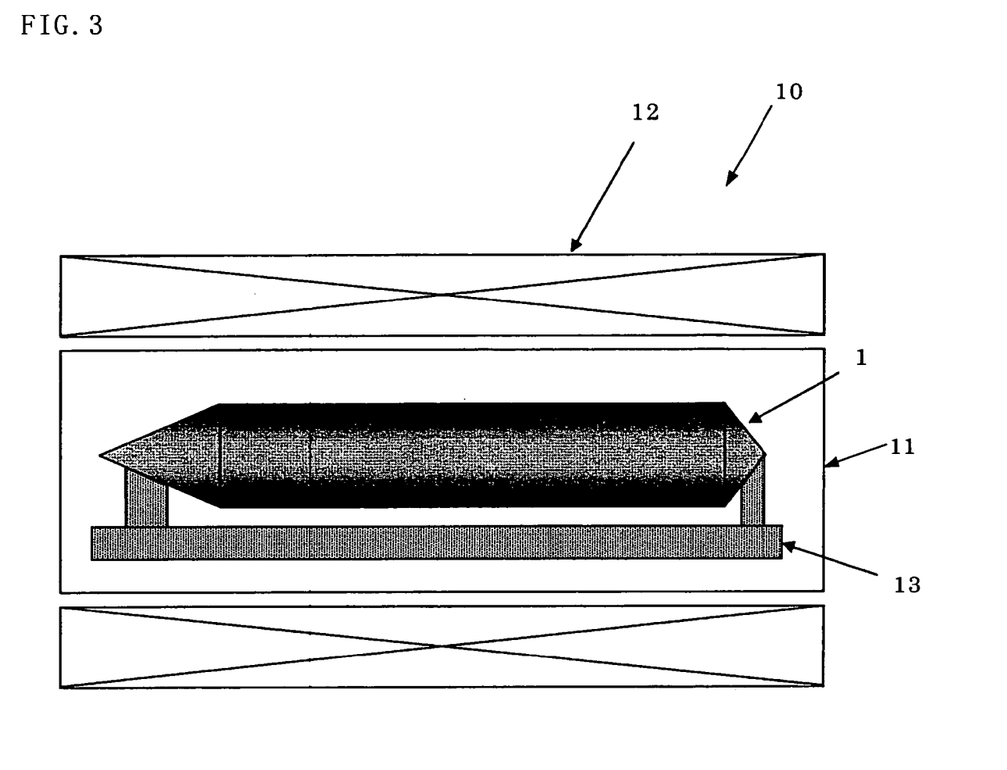
FIG. 3 is an explanatory view showing an example of a horizontal furnace for heat treatment available in an ingot heat-treating step according to the present invention.

In this case, the heat-treating apparatus isn't particularly limited. However, one that can perform heat treatment in a state of an ingot body is preferable, and a horizontal heat-treating furnace as shown in FIG. 3 is preferable. FIG. 3 shows an overview of the horizontal heat-treating furnace. The heat-treating furnace 10 has a chamber 11 made of quartz or SiC in which an ingot 1 can be put as it is without removing a cone part and a tail part and without being divided into a plurality of blocks, and heat treating means such as a heater 12 outside. The ingot 1 is held by supporting parts 13 that can support a cone part and a tail part (if necessary, a supporting part may be also disposed in a center part of the ingot). By using such a apparatus, heat treatment is performed on a condition that BMDs are formed.

It is preferable to subject such a pulled ingot as it is to heat treatment because heat treatment can be performed in a state of as little contamination as possible or in a state of no formation of strain and the like. Moreover, by subjecting an ingot to heat treatment at one time, a very large number of wafers can be treated if converted into wafers.

Next, another embodiment will be exemplified. The following example shows that not a pulled shape as it is, but an ingot in a state that the pulled ingot was cylindrically ground and cut in a shape of a block is subjected to ingot annealing (FIG. 2).

Figure 5:
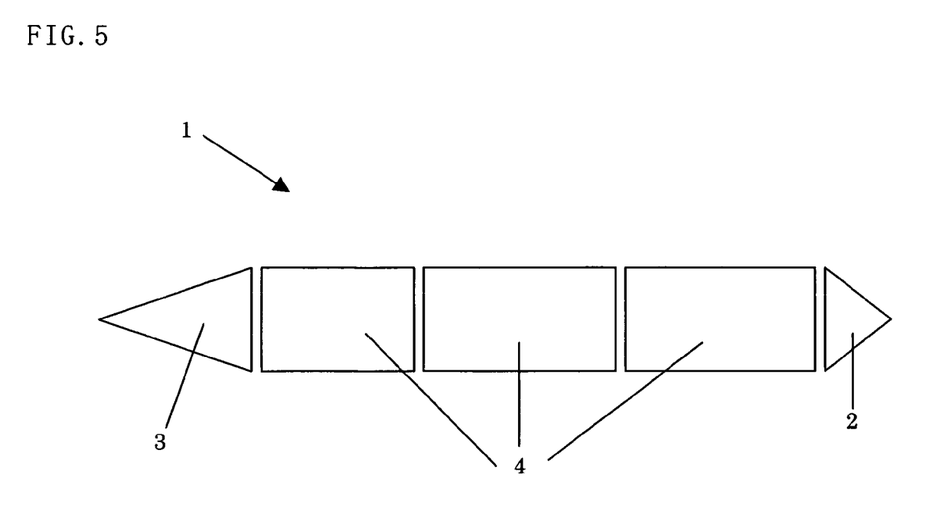
FIG. 5 is a view showing a silicon single crystal cut in a shape of a block after being pulled.

A side surface of an ingot pulled in the growth step of an ingot is cylindrically ground, thereafter as shown in FIG. 5, a cone part 2 and a tail part 3 of the ingot 1 are cut out, and furthermore ingot blocks are obtained by cutting it into a plurality of blocks.

Thereafter, the ingot in a shape of a block is subjected to heat treatment. In addition, in the case that such cylindrical grinding and processing into blocks are performed, because it is possible that contamination or crack is caused by heat treatment. Therefore, metal contamination and such adhering to a surface of the ingot are removed by etching the entire surface of the ingot by several hundreds μm with an etchant. As this etchant, for example, an acidic etchant consisting of $HF/HNO_3$ or the like is used.

Figure 4:
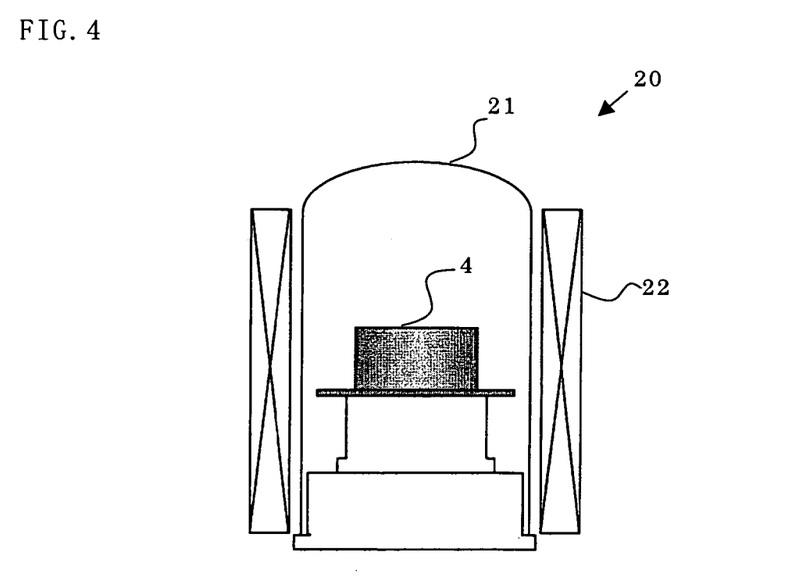
FIG. 4 is an explanatory view showing an example of a vertical furnace for heat treatment available in an ingot heat-treating step according to the present invention.

Thereafter, the ingot in a shape of a block as it is is put in a heat-treating furnace and subjected to heat treatment. The heat-treating apparatus isn't particularly limited. However, for example, the one as shown in FIG. 4, which can subject an ingot block having such a shape as it is to heat treatment, is preferable. The heat-treating furnace 20 shown in FIG. 4 is an apparatus in which an ingot block 4 can be put vertically and subjected to heat treatment. And, the furnace has a form that the ingot block 4 is taken in a chamber 21 consisting of quartz or SiC from under the heat-treating furnace 20 and heat treatment is performed by heat-treating means such as a heater 22 disposed outside, which is so-called a vertical heat-treating furnace. By using such a heat-treating furnace, heat treatment is performed on the condition that BMDs can be formed. Such heat treatment of the silicon single crystal in a state of a block is preferable because a heat-treating furnace can be downsized.

Even in the case of heat-treating an ingot cylindrically ground and cut in a shape of a block after being pulled, a heat-treatment boat for wafers is not necessary, and thus a large amount of silicon single crystal can be subjected to heat treatment at one time, as converted into the case that heat treatment is performed in a state of a wafer, a very large number of wafers can be subjected to heat treatment at one time.

The concrete heat-treating condition of the ingot heat-treating step (BMD forming step, the first heat-treating step) as described above may be appropriately set according to the required specifications. In particular, if heat treatment at 700° C. to 1100° C. is performed in an oxygen atmosphere for 30 minutes to 8 hours, desired BMDs can be sufficiently generated. In practice, temperature may be raised at a high rate of about 10° C./min from the room temperature to about 500° C., and thereafter the temperature rising rate is slowed to be about 0.5° C./min to 5° C./min until the set temperature. By such a method, the temperature is gradually raised until the set temperature (for example, 1000° C.) and the set temperature is maintained for a given time (for example, one hour). After that, cooling is done at a temperature descending rate of about 5° C./min until 600° C., and then the temperature is lowered at about 2° C./min until the room temperature to end the heat treatment. In this way, BMDs are formed in the ingot at high density, which are not annihilated even if heat treatment at about 1000° C. for forming a DZ layer in a state of a wafer or epitaxial growth is performed thereafter.

<Wafer Processing Step>

Figure 8:
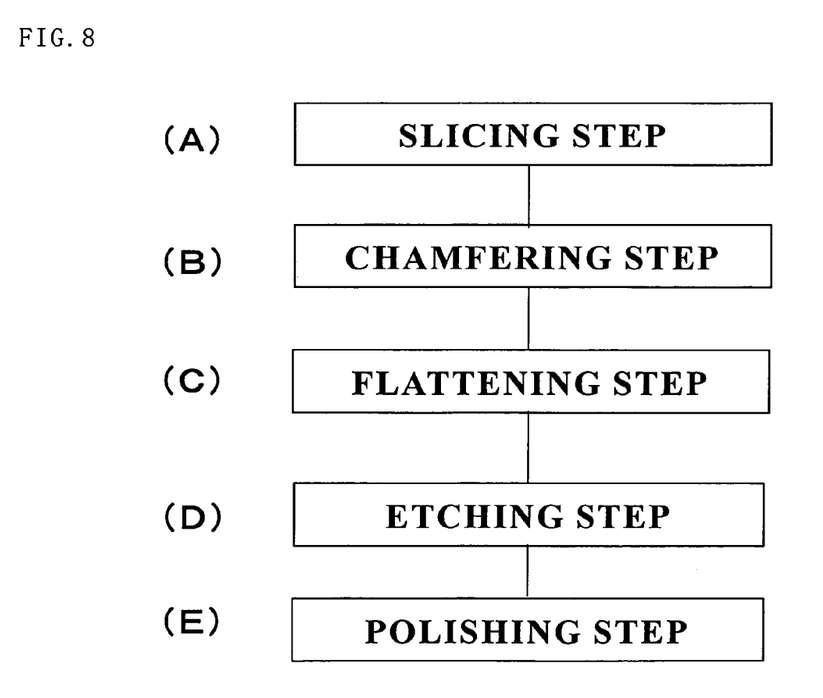
FIG. 8 is a flow diagram showing an example of a wafer processing step in the present invention.

Next, the ingot subjected to ingot annealing as described above is processed into wafers. In the wafer processing, if at least a wafer with high flatness can be obtained, the process is not particularly limited. In this embodiment, as shown in FIG. 8, after a single crystal silicon ingot is sliced to produce thin plates (wafers)(FIG. 8(A)), and for the silicon wafers, there is performed each step of chamfering (FIG. 8(B)), flattening (lapping) (FIG. 8(C)), etching (FIG. 8(D)), polishing (FIG. 8(E)), and such, in order. And finally, mirror-polished wafers are obtained. Condition of each of the steps is not limited. However, the slicing step (FIG. 8(A)) is performed by slicing using a wire saw, and the flattening step (FIG. 8(C)) is performed by lapping (step), flat-surface grinding (step), or the like. For example, in the lapping step, loose abrasive of #1500 or more are used to perform lapping. Next, etching using an alkaline solution may be used in the etching step (FIG. 8(D)), and the polishing step (FIG. 8(E)) may be performed by multiple steps of polishing in combination of double-side polishing and one-side polishing. Also, with respect to the chamfering step (FIG. 8(B)), rough-chamfering, polishing the chamfered part to be a mirror surface (mirror-chamfering) and the like are performed before the flattening. In addition, a cleaning step may be performed after polishing or between the respective steps.

As described above, by processing into wafers after performing ingot annealing, wafers with high IG capability can be easily produced.

Production of Annealed Wafer

Figure 9:
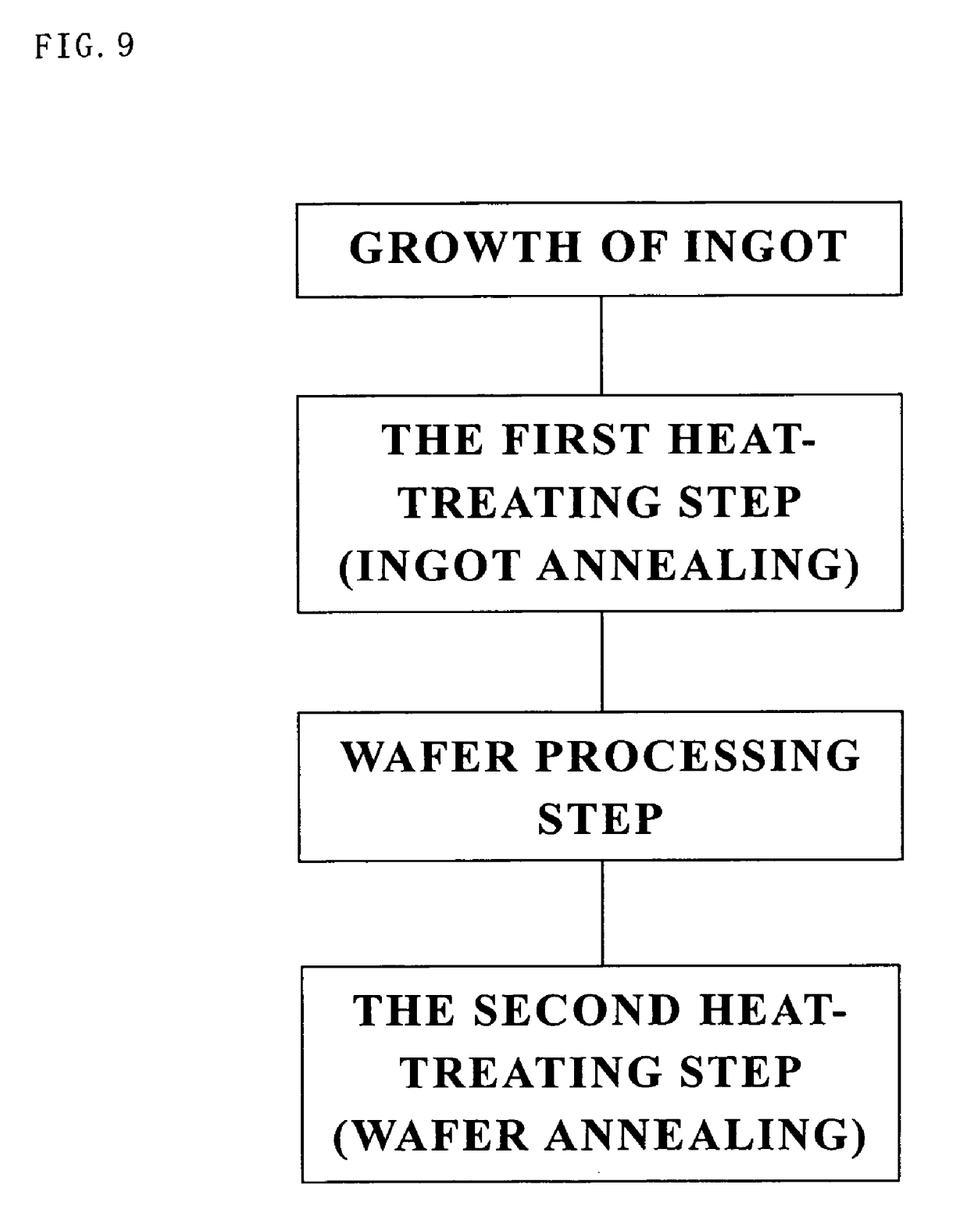
FIG. 9 is a flow diagram showing an overview of a process for producing an annealed wafer according to the present invention.

Next, a method for producing an annealed wafer according to the present invention is explained with reference to drawings. FIG. 9 is a flow diagram showing an overview of steps of producing an annealed wafer according to the present invention.

<Growth of an Ingot, Ingot Annealing, Wafer Processing>

After an ingot is grown and ingot annealing is performed in the same manner as described above, the ingot is processed to wafers and thereby wafers with high IG capability can be easily produced. In addition, a step for improving a state of the wafer surface such as mirror-polishing can also performed after the after-mentioned second heat-treating step.

<Wafer Annealing: The Second Heat-Treating Step>

The mirror-polished wafers as described above are subjected to heat treatment. In the annealing of the wafers, a conventional apparatus and such can be utilized as they are. For example, a vertical heat-treating furnace 30 performs as shown in FIG. 6 can be used. The heat-treating furnace 30 performs heating of the inside of a chamber 31 by a heater 32 disposed around the chamber 31, and during heat treatment, an inert gas such as argon is introduced from a gas-introducing duct 33 and an unnecessary gas is exhausted from a gas-exhausting duct 34. A plurality of wafers W to be subjected to heat treatment are set in a heat-treating boat 40 and disposed in the chamber 31. For the heat-treating boat 40, for example, one shown in FIG. 7 is used. The heat-treating boat 40 consists of a plurality of columns 42 and connection parts 41 connecting the columns 42 at both ends thereof. In the columns 42, for setting wafers W, groove-like wafer-placed parts 43 are provided and the wafers W can be held.

In the present invention, because ingot annealing is performed in an ingot heat-treating step (the first heat-treating step), heat treatment can be performed in a simpler sequence than a conventional condition of heat treatment. Therefore, time is shortened and production of annealed wafers can be performed with good productivity.

The condition of heat treatment of a wafer heat-treating step (the second heat-treating step) is mainly aimed at forming a defect-free region (DZ layer) in the wafer surface. Preferably, the heat treatment is performed at 900° C. to 1300° C. for 5 minutes to 16 hours to grow a DZ layer. At 900° C. or more, formation of a DZ layer can be performed in a short time and furthermore a sufficient DZ thickness can be obtained. Moreover, at 1300° C. or less, generation of slip due to deformation of the wafer or the like is difficult to be caused. Moreover, heat-treating time may be appropriately set according to the required thickness of the DZ layer. As set to be a longer time, the DZ thickness is easy to become larger.

In particular, in such a conventional DZ-IG heat-treatment that a higher temperature heat treatment is continuously performed after a lower temperature heat treatment, it is necessary that temperature is slowly raised during wafer annealing so that BMDs are formed and not annihilated. However if heat treatment is performed in advance in a state of an ingot as the present invention, the temperature rising at the wafer annealing step can be performed faster. For example, even if the wafers are treated at a temperature rising rate of 5° C./min or more, annealed wafers with sufficient BMD density can be obtained.

By such steps for producing a wafer, in addition that a heat treatment in ingot annealing can be efficiently performed, a temperature rising time in wafer annealing can be significantly shortened and the wafer annealing time can be shortened.

Moreover, as the wafer annealing time be shorter, metal contamination and such can be reduced and good annealed wafers can be obtained.

Production of Epitaxial Wafer

Figure 10:
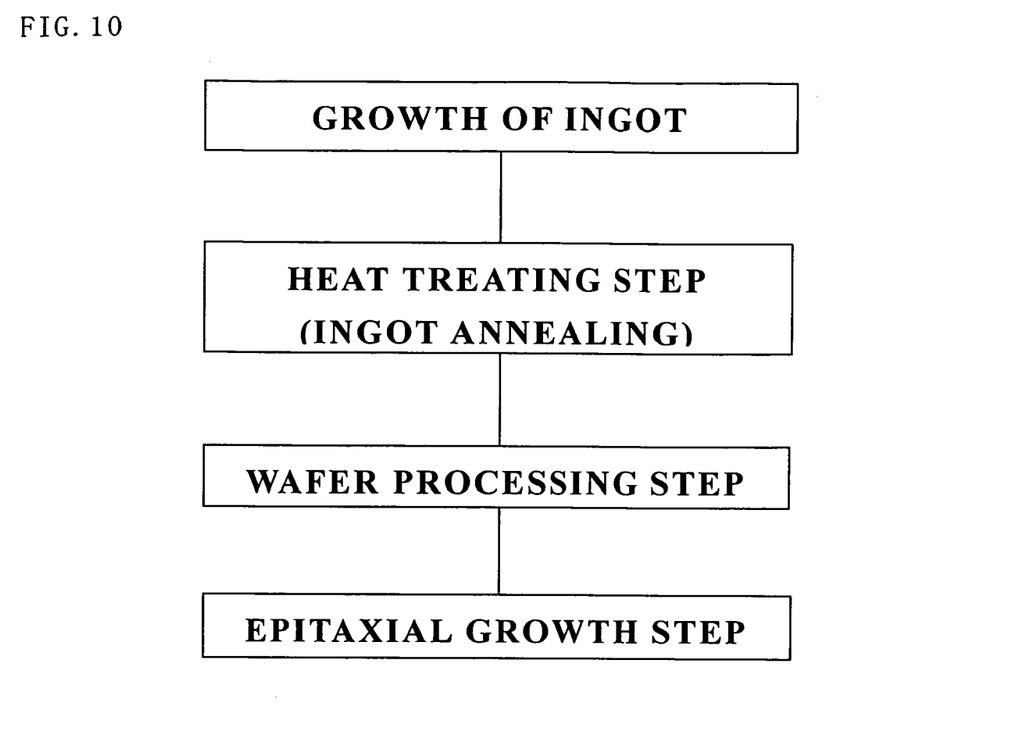
FIG. 10 is a flow diagram showing an overview of a process for producing an epitaxial wafer according to the present invention.

Next, a method for producing an epitaxial wafer according to the present invention with reference to drawings. FIG. 10 is a flow diagram showing an overview of steps of producing an epitaxial wafer according to the present invention.

<Growth of an Ingot>

First, growth of an ingot is performed. A silicon single crystal may be grown by CZ method in the same manner as described above. Also in this case, the silicon single crystal is particularly doped with nitrogen, thereby BMDs can be easily formed and a silicon single crystal with few epitaxial-layer defects can be grown.

Moreover, by using a silicon single crystal in nearly perfect crystal (NPC) region, an epitaxial wafer with very few defects in the epitaxial-layer can be produced.

<Ingot Annealing>

The concrete heat-treating condition of an ingot heat-treating step may be appropriately set according to the required specifications. In particular, if heat treatment at 700° C. to 900° C. is performed in an oxygen atmosphere for 30 minutes to 8 hours, desired BMDs can be sufficiently formed. In practice, temperature may be raised at a high rate of about 10° C./min from the room temperature to about 500° C., and thereafter the temperature rising rate is slowed to be about 0.5° C./min to 5° C./min until the set temperature. By such a method, the temperature is gradually raised until the set temperature (for example, 800° C.) and the set temperature is maintained for a given time (for example, 4 hours). After that, cooling is done at a temperature descending rate of about 5° C./min until 600° C., and the temperature is lowered at about 2° C./min until the room temperature to end the heat treatment. In this stage, BMDs are formed at such a high density that they are not annihilated even at a temperature of about 1200° C. if the heat treatment is performed for a short time like treatment for forming an epitaxial layer.

<Wafer Processing Step>

Next, the ingot subjected to ingot annealing as described above is processed to be wafers. In the wafer processing, if a wafer subjected to mirror-polishing in at least one main surface thereof to have high flatness can be obtained, the process is not particularly limited. For example, by following the procedure as shown in FIG. 8 as described above, a mirror-polished wafer can be obtained.

<Epitaxial Growth Step>

An epitaxial layer is formed on a surface of such a mirror-polished wafer. In formation of the epitaxial layer, as a pretreatment, a native oxide film and particles that exist on a surface of the silicon single crystal substrate are removed. This is performed by subjecting the substrate to heat treatment in an atmosphere of gas of $H_2$ or mixed gas of $H_2/HCl$ at a high temperature near 1100° C.

Next, a method for forming an epitaxial layer may be a conventional method. For example, a silicon compound gas such as $SiCl_4$, $SiHCl_3$, $SiH_2Cl_2$, or $SiH_4$ and a dopant gas such as $B_2H_6$ or $PH_3$ may be supplied into $H_2$ atmosphere and treatment may be performed in a temperature zone of 1000 to 1300° C.

Figure 11:
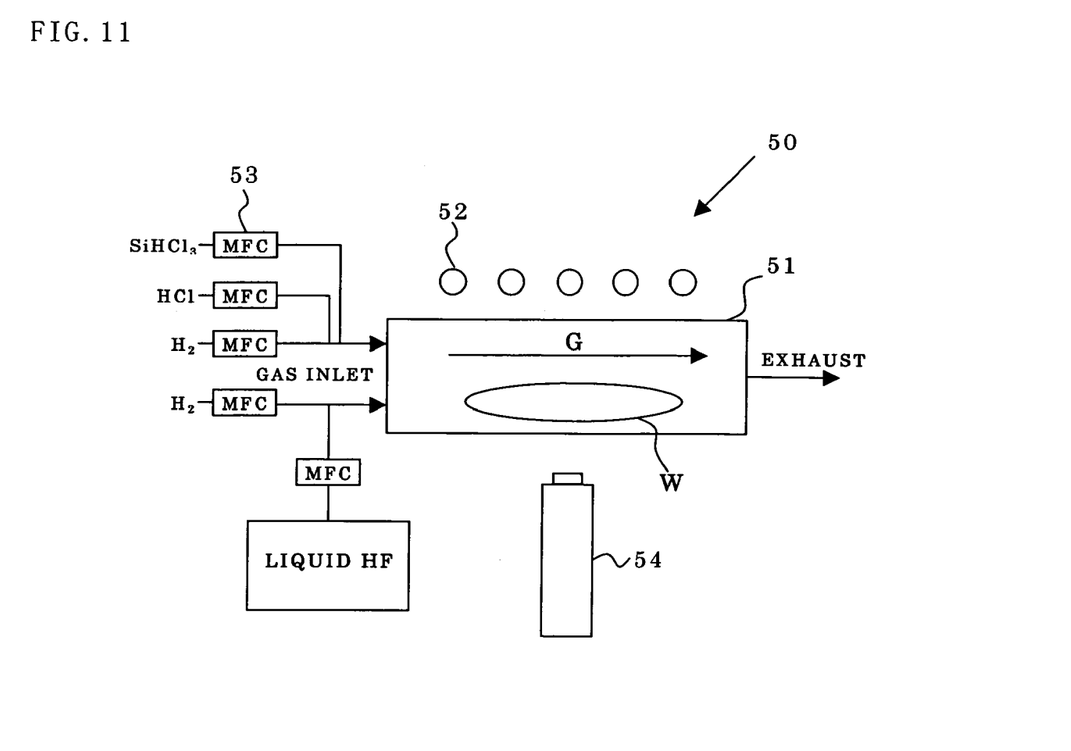
FIG. 11 is an explanatory view showing an example of an epitaxial growth apparatus.

In addition, as an apparatus for epitaxial growth, a conventional apparatus may be used. For example, there can be used an epitaxial growth apparatus that the pretreatment and the epitaxial growth are performed in the same treating chamber. In the epitaxial growth apparatus 50, a wafer W is contained in a treating chamber 51. In FIG. 11, although one wafer W is contained therein, a plurality of wafers may be contained therein. A gas introduced from one end of the above treating chamber 51 is exhausted from the other end of the treating chamber 51 after having contact with the wafer W. The gas flowing through the treating chamber 51 is any gas required for the pretreatment and the growth of an epitaxial layer such as only $H_2$ gas, HF gas diluted with $H_2$ gas, HCl gas diluted with $H_2$ gas, $SiHCl_3$ gas diluted with $H_2$ gas, or the like. All of the component gases are introduced into the treating chamber 51 with its flow rate being precisely controlled by a mass flow controller 53. Because HF is liquid at a normal temperature but its vapor pressure is large and easily evaporated, the evaporated component is mixed with $H_2$ and supplied to the treating chamber 51. Outside the treating chamber 51, infrared lamps 52 are disposed along one main surface thereof, and heating temperature of a wafer W is controlled according to current amount. Moreover, an irradiation thermometer 54 is disposed in the side of the other main surface of the treating chamber 51, and the wafer temperature during process can be monitored. Of course, the part for pretreatment and the part for epitaxial growth may be separated treatment chambers.

As described above, by producing an epitaxial wafer, there can be efficiently produced epitaxial wafers that have few defects in the epitaxial layer and have BMDs at high density.

Hereinafter examples and comparative examples will be explained.

EXAMPLE 1

<Growth of an Ingot>

A silicon single crystal ingot with an oxygen concentration of $13-15 \times 10^{17}$ atoms/cm$^3$ [oldASTM] and with a nitrogen concentration of $5-9 \times 10^{12}$ atoms/cm$^3$ was grown by CZ method. This ingot was cylindrically ground and cut into a plurality of blocks and thereby an ingot with a diameter of about 300 mm and with a length of about 30 cm was obtained.

<Ingot Annealing: BMD Forming Step>

A BMD forming step of subjecting the above ingot to heat treatment in a state of an ingot as it is to form BMDs inside was performed. First, the entire surface of the ingot was etched by about 200 μm by an acidic etchant consisting of $HF/HNO_3$, and thereby metal impurity contaminating a surface thereof was removed.

After that, the ingot was put in the heat-treating furnace as shown in FIG. 4 in a state of an ingot as it is, and heat treatment was performed.

The heat treatment was performed that temperature was raised from the room temperature to 500° C. at a temperature rising rate of 10° C./min, then raised to 1000° C. at a temperature rising rate of 1° C./min, and maintained at 1000° C. for 2 hours. After that, cooling was done at a temperature descending rate of about 5° C./min until 600° C., and thereafter the temperature was lowered at about 2° C./min until the room temperature. As the atmosphere during this heat treatment, an oxygen gas was used.

Thereby, it was possible that as converted into wafers, heat treatment corresponding to 4 batches of general wafer heat-treating boats was performed at one time.

<Wafer Processing Step>

In wafer processing step, the ingot after the BMD forming step was treated according to process as shown in FIG. 8. In slicing step (FIG. 8(A)), the ingot was sliced by using a wire saw. After a chamfering step (FIG. 8(B)), in flattening step (FIG. 8(C)), lapping was performed by using loose abrasive of #1500. In etching step (FIG. 8(D)), the ingot was etched by an alkaline solution using a 50% concentration of NaOH. And thereafter, in polishing step (FIG. 8(E)), three-step polishing consisting of double-side polishing, one-side polishing, and one-side polishing, was performed, and thereby mirror-polished wafers with high flatness were obtained. Thereafter, cleaning was performed. About 300 silicon wafers each having a diameter of 300 mm were obtained from the above ingot with a length of 30 cm.

With regard to the wafers obtained as described above, BMD density was evaluated by an infrared tomographic method. The result was a sufficient BMD density of $3\times10^9$ numbers/cm$^3$. That is, wafers with high IG capability were obtained. Therefore, in the case that by using such a wafer as described above, an annealed wafer is produced so that a DZ layer is formed in the later step, for example, it becomes needless to perform low-temperature heat treatment so that BMDs are formed. Therefore, a heat treatment in a state of a wafer may be only heat treatment performed for mainly forming a DZ layer, and thus heat-treating time can be greatly shortened.

EXAMPLE 2

A silicon single crystal ingot with an oxygen concentration of $13-15\times10^{17}$ atoms/cm$^3$ [oldASTM] was grown by CZ method. With regard to the silicon single crystal, a crystal in NPC region was grown by controlling a growth rate of the crystal. The ingot was cylindrically ground and cut into a plurality of blocks, and thereby an ingot with a diameter of about 300 mm and with a length of about 30 cm was obtained.

After that, by performing BMD forming step and wafer processing step in the same manner as Example 1, about 300 silicon wafers with a diameter of 300 mm were obtained. With regard to the wafers obtained as described above, BMD density was evaluated by an infrared tomographic method. The result was a sufficient BMD density of $3\times10^9$ numbers/cm$^3$. Thus, wafers with high IG capability were obtained.

COMPARATIVE EXAMPLE 1

After ingots were produced in the same manner as Examples 1 and 2, each of them was processed into wafers without performing BMD forming step of performing heat treatment in a state of an ingot. With regard to the wafers, BMD density was evaluated on the same condition as the Examples 1 and 2.

With regard to these wafers obtained from the above ingot, few BMDs were detected even by performing such evaluation as described above because BMDs were not formed only by the processing into wafers without performing BMD forming step in a state of an ingot. Accordingly, for example, in the case that the wafers are used as annealed wafers, heat treatment must be performed in a state of a wafer so that BMDs are formed and grown.

EXAMPLE 3

<Growth of an Ingot>

A silicon single crystal ingot with an oxygen concentration of $13-15\times10^{17}$ atoms/cm$^3$ [OldASTM] and with a nitrogen concentration of $5-9\times10^{12}$ atoms/cm$^3$ was grown by CZ method. This ingot was cylindrically ground and cut into a plurality of blocks and thereby an ingot with a diameter of about 300 mm and with a length of about 30 cm was obtained.

<Ingot Annealing: The First Heat-Treating Step>

The above ingot was subjected to the first heat-treating step in a state of an ingot as it is. First, the entire surface of the ingot was etched by about 200 μm by an acidic etchant consisting of HF/HNO$_3$, and thereby metal impurity contaminating a surface thereof was removed.

After that, the ingot in a state of an ingot was put in the heat-treating furnace as shown in FIG. 4 as it is, and heat treatment was performed.

The heat treatment was performed that temperature was raised from the room temperature to 500° C. at a temperature rising rate of 10° C./min, then raised to 1000° C. at a temperature rising rate of 1° C./min, and maintained at 1000° C. for 2 hours. After that, cooling was done at a temperature descending rate of about 5° C./min until 600° C., and thereafter the temperature was lowered at about 2° C./min until the room temperature. As the atmosphere during this heat treatment, an oxygen gas was used.

Thereby, it was possible that as converted into wafers, heat treatment corresponding to 4 batches of general wafer heat-treating boats were performed at one time.

<Wafer Processing Step>

In wafer processing step, the ingot was treated by a process as shown in FIG. 8. In slicing step (FIG. 8(A)), the ingot was sliced by using a wire saw. After chamfering step (FIG. 8(B)), in flattening step (FIG. 8(C)), lapping was performed by using loose abrasive of #1500. In etching step (FIG. 8(D)), the ingot was etched by an alkaline solution using a 50% concentration of NaOH. And thereafter, in polishing step (FIG. 8(E)), three-step polishing consisting of double-side polishing, one-side polishing, and one-side polishing was performed, and thereby mirror-polished wafers with high flatness were obtained. Thereafter, cleaning was performed. About 300 silicon wafers with a diameter of 300 mm were obtained from the above ingot with a length of 30 cm.

<Wafer Annealing: The Second Heat-Treating Step>

Heat-treatment was performed at one batch of 75 wafers.

A vertical heat-treating furnace as shown in FIG. 6 was used as a heat treatment apparatus, the above wafers were put in a heat treating boat as shown in FIG. 7, and heat treatment was performed.

In the heat treatment, the heat treating boat in which wafers were set was put in a furnace maintained at 700° C. in argon atmosphere and temperature was raised to about 1000° C. at a relatively high rate of about 5° C./min. Temperature was raised at 2° C./min after 1000° C., and heat treatment was performed at 1200° C. for 1 hour. After that, temperature was lowered at a rate of about 2° C./min until 1000° C., and lowered at about 4° C./min in the range of 1000° C. or less, and the heat treating boat (wafers) was brought out at 700° C. from the furnace.

The time required for the wafer annealing was about 6.5 hours.

With regard to annealed wafers obtained as described above, 3 wafers were picked out, and a DZ layer and BMD density were confirmed. As a result, the DZ thickness was about 10.4 μm on average and the BMD density was $5\times10^9$ numbers/cm$^3$ level on average.

With respect to these wafers, generation of slip dislocation was confirmed by X-ray tomography (XRT). No generation of slip dislocation was observed.

Moreover, heavy metal level on wafer surface was checked for 3 wafers after the heat treatment. The heavy metal level was such a low level metal contamination as about a degree of Fe: $1\times10^9$ atoms/cm$^2$, Cu: $9\times10^8$ atoms/cm$^2$, and Ni: $8\times10^8$ atoms/cm$^2$, and by shortening the heat-treating time in a state of a wafer, it was possible that the metal contamination level on the wafers was kept low.

COMPARATIVE EXAMPLE 2

After an ingot was made a conventional state of a wafer, a method for producing an annealed wafer was performed, in which a DZ layer and BMDs were formed by heat treatment.

The wafers were those with a diameter of 300 mm, which underwent a wafer processing step like Example 3. An oxygen concentration and a nitrogen concentration were also the same as Example 3.

In the heat treatment, the heat treating boat in which wafers were set was put in a furnace maintained at 500° C. in argon atmosphere and heat treatment was performed at a very slow temperature rising rate of 1° C./min until 1000° C. so that BMDs were sufficiently formed. After that, temperature was raised at 2° C./min, and heat treatment for forming a DZ layer was performed at 1200° C. for one hour. And then, temperature was lowered at a rate of about 2° C./min until 1000° C., and lowered at about 4° C./min in the range of 1000° C. or less, and the heat treating boat (wafers) was brought out at 700° C. from the furnace.

Time for subjecting wafers to heat treatment was about 14 hours in total.

With regard to annealed wafers obtained as described above, a DZ layer and BMD density were confirmed. As a result, the DZ thickness was about 9.5 µm and the BMD density was a level of $2 \times 10^9$ numbers/cm$^3$ level on average. On such a condition, although about the same degree of wafer quality as Example 3 can be obtained, a very great amount of heat-treating time is required and productivity is bad. Also, compared to Example 3, the heavy metal level on the wafer surface was very bad, about a degree of Fe: $5 \times 10^9$ atoms/cm$^2$, Cu: $1 \times 10^{10}$ atoms/cm$^2$, and Ni: $1 \times 10^9$ atoms/cm$^2$.

In the present invention, in addition that heat treatment can be performed so that BMDs are efficiently formed in ingot annealing, wafer annealing time can be shortened very much. By conducting the present invention on the condition as described above, it was possible that wafer heat-treating time was shortened from about 14 hours in a conventional manner to about 6.5 hours. Thereby, it was possible that productivity was greatly improved.

EXAMPLE 4

<Growth of an Ingot>

A silicon single crystal ingot with an oxygen concentration of $13-15 \times 10^{17}$ atoms/cm$^3$ [oldASTM] and with a nitrogen concentration of $5-9 \times 10^{12}$ atoms/cm$^3$ was grown by CZ method. This ingot was cylindrically ground and cut into a plurality of blocks and thereby an ingot with a diameter of about 300 mm and with a length of about 30 cm was obtained.

<Ingot Annealing: Heat-Treating Step>

The above ingot was subjected to heat-treating step in a state of an ingot as it is. First, the entire surface of the ingot was etched by about 200 µm by an acidic etchant consisting of HF/HNO$_3$, and thereby metal impurity contaminating a surface thereof was removed.

After that, the ingot in a state of an ingot as it is was put in the heat-treating furnace as shown in FIG. 4, and heat treatment was performed.

The heat treatment was performed that temperature was raised from the room temperature to about 500° C. at a temperature rising rate of about 10° C./min and then to 800° C. at a temperature rising rate of about 1° C./min, and maintained at 800° C. for 4 hours. After that, cooling was done at a temperature descending rate of about 5° C./min until 600° C., and thereafter the temperature was lowered at about 2° C./min until the room temperature. As the atmosphere during this heat treatment, an oxygen gas was used.

Thereby wafers to be substrates of epitaxial wafers can be produced at one-time heat treatment in large quantity:

<Wafer Processing Step>

In wafer processing step, the ingot forming step was treated by a process as shown in FIG. 8. In slicing step (FIG. 8(A)), the ingot was sliced by using a wire saw. After chamfering step (FIG. 8(B)), in flattening step (FIG. 8(C)), lapping was performed by using loose abrasive of #1500. In etching step (FIG. 8(D)), the ingot was etched by an alkaline solution using a 50% concentration of NaOH. And thereafter, in polishing step (FIG. 8(E)), three-step polishing consisting of double-side polishing, one-side polishing, and one-side polishing was performed, and thereby mirror-polished wafers with high flatness were obtained. Thereafter, cleaning was performed. About 300 silicon wafers with a diameter of 300 mm were obtained from the above ingot with a length of 30 cm.

<Epitaxial Growth>

On these wafers, an epitaxial layer was formed by using an epitaxial apparatus as shown in FIG. 11. First, a pretreatment was subjected to the wafers. The wafers were put in a treating chamber maintained at 23° C. at 1 atm, a native oxide film on the wafer surface was removed by supplying 1% HF-mixed gas diluted with H$_2$ gas at a flow rate of 100 liters/min for 3 minutes. Next, electricity was conducted through resistance heating furnace that was provided in the outer circumstantial part of the treating chamber and temperature of the wafer was raised to 1000° C. When the temperature became stable, 1% HCl-mixed gas diluted with H$_2$ gas was introduced at a flow rate of 100 liters/min for 1 minutes and thereby an organic thin film was removed.

Next, epitaxial growth was performed. H$_2$ gas atmosphere was made in the treating chamber, and current amount of the infrared lamp provided on the upper side was adjusted, and temperature of the wafer was raised to 1100° C. Immediately after stabilization of temperature, 2% SiHCl$_3$-mixed gas diluted with H$_2$ gas was injected at a flow rate of 100 liters/min for 1 minute with very small amount of B$_2$H$_6$. Thereby, there was obtained an epitaxial wafer on which a silicon single crystal thin film (an epitaxial layer) with a thickness of 3 µm, a resistance of 15 Ωcm, and a boron concentration of $1 \times 10^{15}$/cm$^3$ was grown.

With regard to the epitaxial wafers obtained as described above, BMD density on the substrate side was confirmed. BMDs were revealed by performing heat treatment at 1000° C. for 2 hours and BMD density was measured. As a result of evaluation by infrared tomographic method, high BMD density of about $6 \times 10^9$ atoms/cm$^3$ was obtained. Therefore, it was found that by the method of the present invention, there can be produced an epitaxial wafer in which a large number of BMDs to be gettering sites were formed even though an epitaxial growth heat treatment was performed at a high temperature.

Also, with regard to these wafers, an observation of epitaxial layer defects was carried out. No epitaxial layer defects were detected.

COMPARATIVE EXAMPLE 3

Epitaxial wafers were produced by a general method without subjecting a silicon single crystal to heat treatment in a stage of an ingot. After a silicon single crystal ingot was formed with setting an oxygen concentration and a nitrogen concentration in the same manner as Examples, about 300 silicon wafers with a diameter of 300 mm were produced by performing the same wafer processing step as Example 4.

Sequentially, on the same epitaxial growth condition as Example 4, an epitaxial layer was formed on the wafer.

With regard to the epitaxial wafers obtained as described above, BMD density was confirmed in the same manner as Example 4. As a result, BMD density was about $1 \times 10^8$ numbers/cm$^3$ on average. Thus, if annealing was not performed in the stage of an ingot, BMD density was very small. Accordingly, for obtaining sufficient gettering capability, the wafer needs to be subjected to heat treatment for a long time for forming BMDs.

The present invention is not limited to the embodiments described above. The above-described embodiments are merely examples, and those having the substantially same constitution as that described in the appended claims and providing the similar working effects are included in the scope of the present invention.

For example, in the above-described examples, an ingot was cut into a plurality of blocks and ingot annealing was performed in a state of a block. However, the treatment may be performed in a state of pulled ingot as it is without such cutting. In this manner, an ingot having as little contamination as possible can be treated at one time.

The invention claimed is:

1. A method for producing a wafer comprising at least an ingot heat-treating step of subjecting a silicon single crystal, doped with nitrogen, in a state of an ingot to heat treatment, and a wafer processing step of processing the heat-treated ingot into wafers.

2. The method for producing a wafer according to claim 1, wherein in the ingot heat-treating step, bulk micro defects (BMDs) are formed in the silicon single crystal.

3. The method for producing a wafer according to claim 2, further comprising a wafer heat-treating step of subjecting the wafers to heat treatment after the wafer processing step.

4. The method for producing a wafer according to claim 3, wherein in the wafer heat-treating step, a defect-free region (a DZ (denuded zone) layer) is formed in a surface of the wafer.

5. The method for producing a wafer according to claim 3, wherein in the wafer heat-treating step, the heat treatment is performed at a heat treatment temperature of 900° C. to 1300° C. for 5 minutes to 16 hours.

6. The method for producing a wafer according to claim 3, wherein in the wafer heat-treating step, the temperature is raised at a temperature rising rate of 5° C./min or more.

7. The method for producing a wafer according to claim 1, further comprising a wafer heat-treating step of subjecting the wafers to heat treatment after the wafer processing step.

8. The method for producing a wafer according to claim 7, wherein in the wafer heat-treating step, a defect-free region (a DZ (denuded zone) layer) is formed in a surface of the wafer.

9. The method for producing a wafer according to claim 7, wherein in the wafer heat-treating step, the heat treatment is performed at a heat treatment temperature of 900° C. to 1300° C. for 5 minutes to 16 hours.

10. The method for producing a wafer according to claim 7, wherein in the wafer heat-treating step, the temperature is raised at a temperature rising rate of 5° C./min or more.

11. The method for producing a wafer according to claim 1, wherein in the wafer processing step, the heat-treated ingot is processed into mirror-like wafers.

12. The method for producing a wafer according to claim 11, further comprising an epitaxial growth step of forming an epitaxial layer on the wafer after the processing into the mirror-like wafers.

13. The method for producing a wafer according to claim 12, wherein the epitaxial growth step is that after a pretreatment is performed at a temperature of 1000° C. or more, the epitaxial growth is performed at a temperature of 1000° C. or more.

14. The method for producing a wafer according to claim 1, wherein in the ingot heat-treating step, the silicon single crystal in a state of an ingot is subjected to heat treatment at 700° C. or more.

15. The method for producing a wafer according to claim 14, wherein in the ingot heat-treating step, the heat treatment is performed at a heat treatment temperature of 1100° C. or less for 30 minutes to 8 hours.

16. The method for producing a wafer according to claim 15, wherein in the ingot heat-treating step, the heat treatment is performed at a heat treatment temperature of 700° C. to 900° C. for 30 minutes to 8 hours.

17. The method for producing a wafer according to claim 1, wherein in the ingot heat-treating step, the heat treatment is performed at a temperature rising rate of 0.5° C./min to 10° C./min.

18. The method for producing a wafer according to claim 1, wherein the silicon single crystal is a crystal in a nearly perfect crystal (NPC) region produced by Czochralski method.

19. The method for producing a wafer according to claim 1, wherein the silicon single crystal in a state of an ingot is an ingot pulled by a single crystal-pulling apparatus according to Czochralski method as it is or an ingot in a state that the pulled ingot is cylindrically ground and cut in a shape of a block.

* * * * *